United States Patent
Niu et al.

(10) Patent No.: US 10,015,476 B2
(45) Date of Patent: Jul. 3, 2018

(54) DISPLAY MODULE, DISPLAY DEVICE AND DRIVING METHOD

(71) Applicants: BOE Technology Group Co., Ltd., Beijing (CN); Beijing BOE Optoelectronics Technology Co., Ltd., Beijing (CN)

(72) Inventors: Xiaochen Niu, Beijing (CN); Xue Dong, Beijing (CN); Xiaochuan Chen, Beijing (CN); Wenqing Zhao, Beijing (CN); Pengcheng Lu, Beijing (CN); Ming Yang, Beijing (CN); Qian Wang, Beijing (CN); Rui Xu, Beijing (CN); Lei Wang, Beijing (CN); Jian Gao, Beijing (CN)

(73) Assignees: BOE Technology Group Co., Ltd., Beijing (CN); Beijing BOE Optoelectronics Technology Co., Ltd., Beijing (CN)

( * ) Notice: Subject to any disclaimer, the term of this patent is extended or adjusted under 35 U.S.C. 154(b) by 0 days.

(21) Appl. No.: 15/505,164

(22) PCT Filed: Jun. 29, 2016

(86) PCT No.: PCT/CN2016/087624
§ 371 (c)(1),
(2) Date: Feb. 20, 2017

(87) PCT Pub. No.: WO2017/117928
PCT Pub. Date: Jul. 13, 2017

(65) Prior Publication Data
US 2018/0027228 A1    Jan. 25, 2018

(30) Foreign Application Priority Data
Jan. 4, 2016  (CN) .......................... 2016 1 0006369

(51) Int. Cl.
*H01L 27/32* (2006.01)
*G02F 1/1335* (2006.01)
(Continued)

(52) U.S. Cl.
CPC ... *H04N 13/0413* (2013.01); *G02F 1/133621* (2013.01); *G09G 3/04* (2013.01);
(Continued)

(58) Field of Classification Search
CPC ........... H04N 13/0413; H04N 13/0422; H04N 13/0454
See application file for complete search history.

(56) References Cited

U.S. PATENT DOCUMENTS

2008/0252720 A1   10/2008  Kim et al.
2013/0050594 A1    2/2013  Hirayama et al.
(Continued)

FOREIGN PATENT DOCUMENTS

| CN | 1376014 A | 10/2002 |
| CN | 101094424 A | 12/2007 |

(Continued)

OTHER PUBLICATIONS

Aug. 2, 2017—(CN) First Office Action Appn 201610006369.2 with English Tran.
Sep. 29, 2016—International Search Report and Written Opinion Appn PCT/CN2016/087624 with Eng Tran.

*Primary Examiner* — Anand S Rao
*Assistant Examiner* — Tyler B Edwards
(74) *Attorney, Agent, or Firm* — Banner & Witcoff, Ltd.

(57) ABSTRACT

A display module capable of achieving a conversion between 2D display and 3D display, comprises a display panel and a light modulating component. The display panel comprises a plurality of pixels, each of which comprises three first sub-pixels arranged in a triangular pattern. All of the first sub-pixels are arranged in a plurality of rows in a
(Continued)

first direction and in a plurality of rows in a second direction which is substantially perpendicular to the first direction, and the first sub-pixels in each row are arranged at intervals. The light modulating component comprises a first light modulating unit configured to adjust transmittance of light emitted to the left eye by the respective first sub-pixels of the display panel and a second light modulating unit configured to adjust transmittance of light emitted to the right eye by the respective first sub-pixels of the display panel. A display device and a driving method thereof are further disclosed.

20 Claims, 6 Drawing Sheets

(51) Int. Cl.
  *G09G 3/04* (2006.01)
  *H04N 13/04* (2006.01)
  *G02F 1/1368* (2006.01)
(52) U.S. Cl.
  CPC ..... *H01L 27/3232* (2013.01); *H04N 13/0422* (2013.01); *H04N 13/0454* (2013.01); *G02F 1/1368* (2013.01); *G02F 2201/44* (2013.01); *G02F 2203/34* (2013.01); *G09G 2300/0452* (2013.01); *H01L 27/3244* (2013.01)

(56) References Cited

U.S. PATENT DOCUMENTS

| | | |
|---|---|---|
| 2014/0111712 A1 | 4/2014 | Wu |
| 2015/0181202 A1 | 6/2015 | Niu et al. |
| 2015/0241710 A1 | 8/2015 | Chen et al. |
| 2016/0366401 A1 | 12/2016 | Wu et al. |

FOREIGN PATENT DOCUMENTS

| | | | |
|---|---|---|---|
| CN | 101285938 A | | 10/2008 |
| CN | 101371183 A | | 2/2009 |
| CN | 201716500 U | | 1/2011 |
| CN | 102469331 A | | 5/2012 |
| CN | 102944961 A | | 2/2013 |
| CN | 102955258 A | | 3/2013 |
| CN | 103345087 A | | 10/2013 |
| CN | 103513465 A | | 1/2014 |
| CN | 103945203 A | | 7/2014 |
| CN | 104199193 A | | 12/2014 |
| CN | 104614865 A | | 5/2015 |
| CN | 105093546 A | | 11/2015 |
| CN | 105158915 A | | 12/2015 |
| CN | 105334632 A | | 2/2016 |
| CN | 105607271 A | | 5/2016 |
| JP | 2009103866 A | | 5/2009 |
| JP | 2009103866 A | * | 5/2009 |

* cited by examiner

_DISPLAY MODULE, DISPLAY DEVICE AND DRIVING METHOD_

CROSS-REFERENCE TO RELATED APPLICATION

The application is a U.S. National Phase Entry of International Application No. PCT/CN2016/087624 filed on Jun. 29, 2016, designating the United States of America and claiming priority to Chinese Patent Application No. 201610006369.2 filed on Jan. 4, 2016. The present application claims priority to and the benefit of the above-identified applications and the above-identified applications are incorporated by reference herein in their entirety.

TECHNICAL FIELD

The present disclosure relates to the display technology field, and in particular to a display module, a display device and a driving method thereof.

BACKGROUND

At present, 3D (three-dimensional) display is extremely welcomed by a vast number of consumers due to its real and vivid expressive ability, beautiful and elegant environment appeal, and strong shock of visual impact. The principle of 3D (three-dimensional) display is that a viewer's left and right eyes respectively receive images with slight differences, i.e., a left view and a right view, which are fused by the viewer's brain after a comprehensive analysis, so that the viewer perceives a depth of an object in a screen, thereby generating a three-dimensional effect.

Early 3D display devices require viewers to wear appropriate 3D glasses, so that a wide-spread use thereof is restricted by environment and equipment. Naked-eye 3D display devices developed in recent years has overcome the shortcomings of early 3D display devices, which makes the naked-eye 3D display devices attract wide attention.

SUMMARY

I. Technical Problems to be Solved

Embodiments of the present disclosure provide a display module, a display device and a driving method thereof, through which switching between 2D display and 3D display can be more easily achieved.

II. Technical Solution

To achieve the purpose mentioned above, embodiments of the present disclosure adopt the following technical solution.

According to the first aspect of the present disclosure, embodiments of the present disclosure provide a display module, comprising a display panel and a light modulating component, the display panel comprises a plurality of pixels, each of which comprises three first sub-pixels arranged in a triangular pattern, wherein all of the first sub-pixels are arranged in a plurality of rows in a first direction and in a plurality of rows in a second direction, and the first sub-pixels in each row are arranged at intervals, the first direction being substantially perpendicular to the second direction; and the light modulating component comprises a first light modulating unit configured to adjust transmittance of light emitted to the left eye by the respective first sub-pixels of the display panel and a second light modulating unit configured to adjust transmittance of light emitted to the right eye by the respective first sub-pixels of the display panel.

In an optional embodiment, two of the first sub-pixels in any one of the pixels are arranged in the first direction and the interval between two adjacent first sub-pixels in each row along the first direction is substantially equal.

In an optional embodiment, along the second direction, the colors of light emitted by the first sub-pixels in each row are the same, and for any three adjacent rows, the colors of light emitted by the first sub-pixels in different rows are different.

In an optional embodiment, the first sub-pixels in each row are separated by black matrixes.

In an optional embodiment, the first sub-pixels in each row are separated by black sub-pixels.

In an optional embodiment, the display panel is an OLED display panel.

In an optional embodiment, the light modulating component is a liquid crystal display panel which comprises a plurality of second sub-pixels; and the first light modulating unit and the second light modulating unit each comprise at least one of the second sub-pixels.

In an optional embodiment, the liquid crystal display panel does not comprise a color film.

In an optional embodiment, two of the first sub-pixels in any one of the pixels are arranged in the first direction and the interval between two adjacent first sub-pixels in each row along the first direction is substantially larger than a length of the first sub-pixel along the first direction.

In an optional embodiment, each of the second sub-pixels in the light modulating component has a size smaller than that of each of first the sub-pixels in the display panel.

According to the second aspect of the disclosure, embodiments of the disclosure provides a display device, comprising the display module mentioned above, a first processing unit connected with the display panel in the display module; and a second processing unit connected with the light modulating component in the display module, the first processing unit is configured to control the first sub-pixels in each pixel of the display panel to emit light of three primary colors; and the second processing unit is configured to control the light transmittances of the first light modulating unit and the second light modulating unit in the light modulating component, so that the respective first sub-pixels in the display module output the left-eye image through the first light modulating unit and output the right-eye image through the second light modulating unit.

In an optional embodiment, the display device further comprises a 2D/3D switching control unit connected with the second processing unit, wherein the 2D/3D switching control unit is configured to control the light transmittances of the first light modulating unit and the second light modulating unit through the second processing unit in 2D display, so that the left-eye image output by the respective first sub-pixels through the first light modulating unit and the right-eye image output by the respective first sub-pixels through the second light modulating unit are identical; and the 2D/3D switching control unit is configured to control the light transmittances of the first light modulating unit and the second light modulating unit through the second processing unit in 3D display, so that the left-eye image output by the respective first sub-pixels through the first light modulating unit and the right-eye image output by the respective first sub-pixels through the second light modulating unit are different.

According to the third aspect of the disclosure, embodiments of the disclosure provides a driving method of the display device mentioned above, comprising: controlling the first sub-pixels within each pixel in the display panel to emit light of three primary colors; and controlling the light transmittances of the first light modulating unit and the second light modulating unit in the light modulating component, so that the respective first sub-pixels output a left-eye image through the first light modulating unit and output a right-eye image through the second light modulating unit.

In an optional embodiment, the driving method further comprising: in 2D display, controlling the light transmittances of the first light modulating unit and the second light modulating unit, so that the left-eye image output by the respective first sub-pixels through the first light modulating unit and the right-eye image output by the respective first sub-pixels through the second light modulating unit are identical, and in 3D display, controlling the light transmittances of the first light modulating unit and the second light modulating unit, so that the left-eye image output by the respective first sub-pixels through the first light modulating unit and the right-eye image output by the respective first sub-pixels through the second light modulating unit are different.

Beneficial Effects

The technical solution according to the disclosure can produce the following beneficial effects:

In the display module, the display device and the driving method thereof according to embodiments of the present disclosure, through a configuration in which the three first sub-pixels in each pixel of the display panel are arranged in a triangular pattern and the first sub-pixels are arranged at intervals in the first direction and the second direction and through a configuration in which the light modulating component is disposed on the light-emitting side of the display panel, the respective first sub-pixels in the display panel can be directed to the left eye only through the first light modulating unit in the light modulating component and the respective first sub-pixels can be directed to the right eye only through the second light modulating unit in the light modulating component. On the basis of the above, by the adjustment of the light transmittances by the light modulating units, gray scales output to the right and left eyes from the respective first sub-pixels are made different from each other, so that the respective first sub-pixels output a left-eye image through the first light modulating unit and a right-eye image through the second light modulating unit which are different from each other. On the basis of this, the left-eye image and the right-eye image are fused by the viewer's brain after a comprehensive analysis, so that the viewer perceives the depth of an object in the screen, thereby producing a three-dimensional effect, i.e. achieving 3D display. When the gray scales output to the right and left eyes from the respective first sub-pixels are made identical, since the respective first sub-pixels output a left-eye image through the first light modulating unit and a right-eye image through the second light modulating unit which are identical, 2D display is achieved. On the basis of this, a switching between 2D display and 3D display can be achieved in a more convenient manner.

BRIEF DESCRIPTION OF THE DRAWINGS

In order to more clearly illustrate the technical solutions of the embodiments of the present disclosure or the technical solutions of the prior art, the drawings for illustrating the embodiments will be briefly described in the following. It is obvious that the drawings described below are only some embodiments of the present disclosure. One of ordinary skills in the art can obtain other drawings from these drawings without any creative works.

REFERENCE SIGNS

10—display panel; 101—first sub-pixel; 1011—anode; 1012—organic material functional layer; 1013—cathode; 110—first display unit; 120—second display unit; 11—grating; 111—light transmitting region; 112—light blocking region; 20—light modulating component; 201—first light modulating unit; 202—second light modulating unit; 203—second sub-pixel; 21—array substrate; 22—cell substrate; 23—liquid crystal layer; 24—lower polarizer; 25—upper polarizer; 30—sealant; 41—first processing unit; 42—second processing unit; 50—2D/3D switching control unit.

DETAILED DESCRIPTION

Hereinafter, embodiments of the present disclosure will be described in further detail with reference to the accompanying drawings and examples. The following embodiments are provided by way of illustration only and are not intended to limit the scope of the present disclosure.

In order to make the objects, technical solutions and advantages of the embodiments of the present disclosure more clear, the technical solutions of the embodiments of the present disclosure will be clearly and completely described below with reference to the accompanying drawings of the embodiments of the present disclosure. Obviously, the described embodiments are a part of the embodiments of the present disclosure, rather than all of the embodiments. Based on the described embodiments of the present disclosure, all other embodiments conceived by one of ordinary skills in the art are intended to be within the scope of the present disclosure.

Unless otherwise defined, technical terms or scientific terms used herein should be in the general meaning as understood by one of ordinary skills in the art to which this disclosure belongs. The terms "first", "second" and the like as used in the specification and claims of the present disclosure do not denote any order, quantity or importance but are merely used to distinguish different constituent parts. Likewise, the terms "a" or "an" and the like do not denote a numerical limitation, but rather denote the presence of at least one. The terms "connected" or "connecting" and the like are not limited to physical or mechanical connections, but may include electrical connections, whether direct or indirect. The terms "upper", "lower", "left", "right" and the like are used to indicate relative position relationships between objects, and the relative position relationship will be changed if absolute position of the objects described is changed.

In order that the technical problem to be solved by the present disclosure, technical solution and advantages become clearer, the following detailed description will be made in connection with the accompanying drawings and the specific embodiments.

Figure 1:
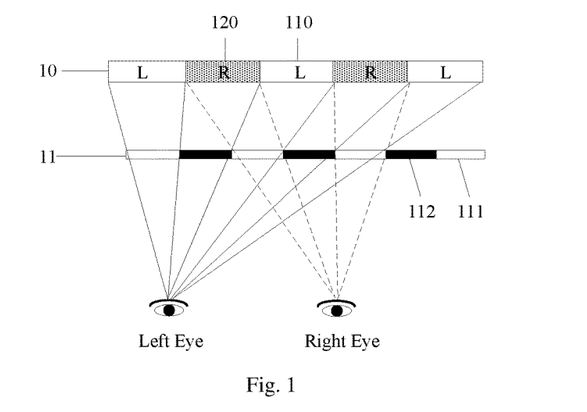
FIG. 1 is an illustrative view of 3D display of prior arts.

FIG. 1 shows a naked-eye 3D display device of the prior art, comprising a display panel 10 and a grating 11 disposed on a light emitting side of the display panel 10. The display panel 10 comprises a plurality of first display units 110 displaying left-eye images L and a plurality of second display units 120 displaying right-eye images R. The grating 11 comprises light transmitting regions 111 and light blocking regions 112. The grating 11 has an image separating function, as shown in FIG. 1, so that the left-eye images L are only visible to the human's left eye, while the right-eye images R are only visible to the right eye, which produces three-dimensional effect.

Figure 2A:
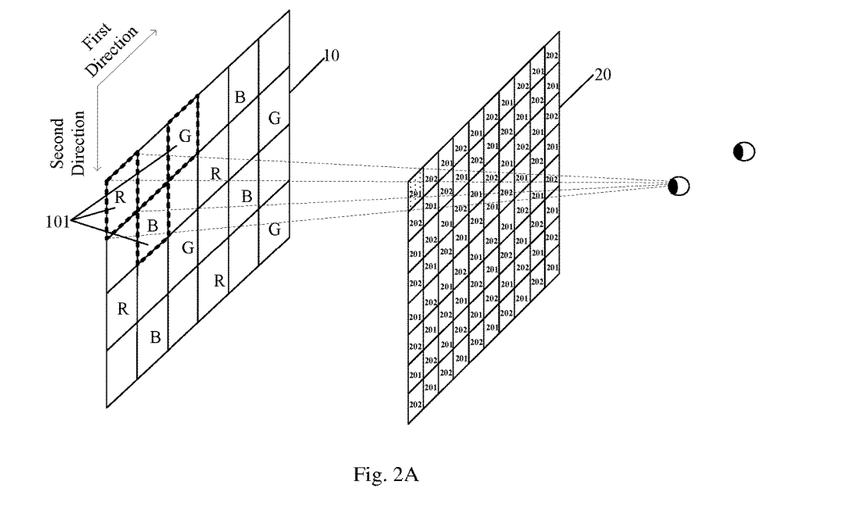
FIG. 2A is a first illustrative view of a display module according to an embodiment of the present disclosure.
Figure 2B:
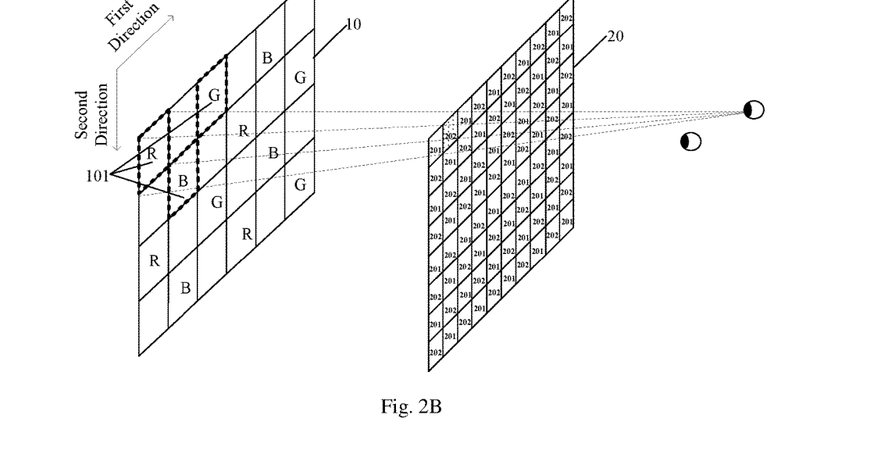
FIG. 2B is a second illustrative view of a display module according to an embodiment of the present disclosure.
Figure 3A:
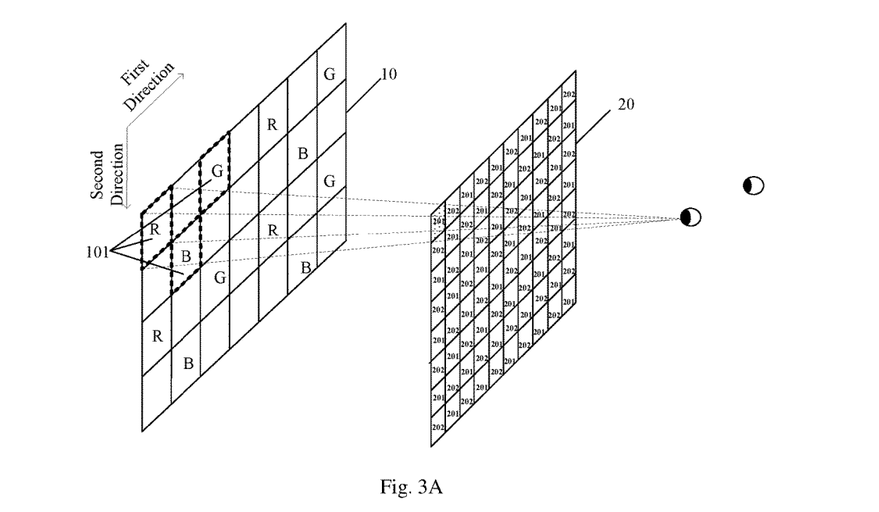
FIG. 3A is a first illustrative view of another display module according to an embodiment of the present disclosure.
Figure 3B:
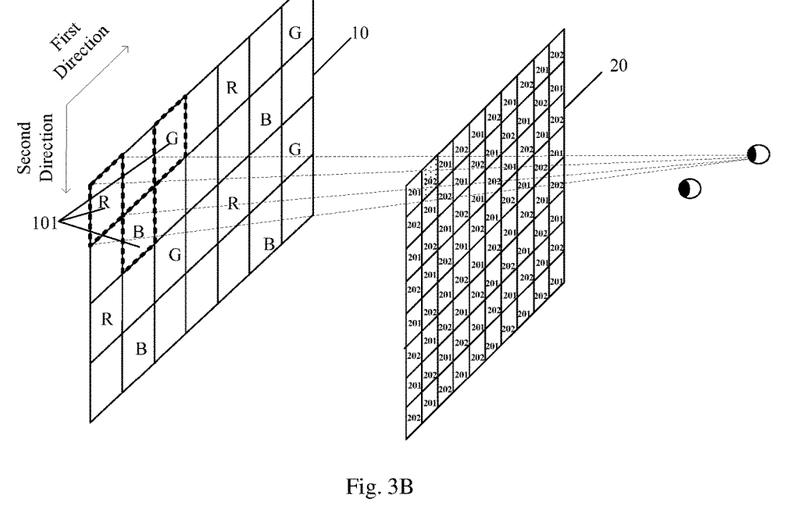
FIG. 3B is a second illustrative view of another display module according to an embodiment of the present disclosure.
Figure 4:
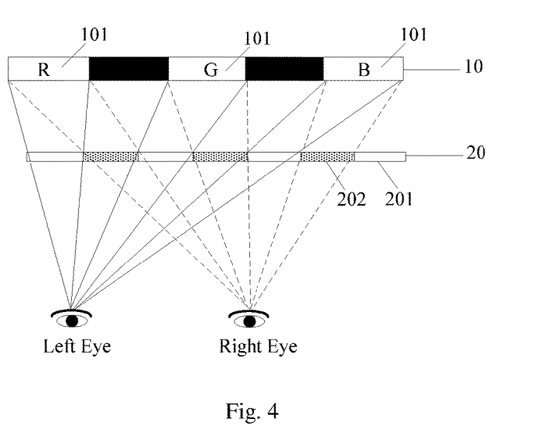
FIG. 4 is an illustrative view of the 2D/3D display achieved by the display module illustrated in FIG. 2A, FIG. 2B, FIG. 3A or FIG. 3B and according to an embodiment of the present disclosure.

The embodiments of the present disclosure provide a display module, as illustrated in FIG. 2 to FIG. 4, comprising a display panel 10 and a light modulating component 20.

The display panel 10 comprises a plurality of pixels, each of which comprises three first sub-pixels 101 arranged in a triangular pattern (as indicated by the dashed boxes in the figure). All of the first sub-pixels 101 are arranged in a plurality of rows in a first direction and in a plurality of rows in a second direction. The first sub-pixels 101 in each row are arranged at intervals. The first direction is substantially perpendicular to the second direction.

As illustrated in FIG. 2 to FIG. 4, the light modulating component 20 comprises a first light modulating unit 201 and a second light modulating unit 202. As illustrated in FIG. 2A, FIG. 3A or FIG. 4, the first light modulating unit 201 is configured to adjust the transmittance of light emitted to the left eye by the respective first sub-pixels 101 of the display panel 10. In addition, as illustrated in FIG. 2B, FIG. 3B or FIG. 4, the second light modulating unit 202 is configured to adjust the transmittance of light emitted to the right eye by the respective first sub-pixels 101 of the display panel 10.

It is to be noted that in a first aspect the type of the display panel 10 shall not be restricted, as long as the first sub-pixel 101 in each pixel can emit light of three primary colors. For example, the display panel 10 can be an OLED (Organic Light Emitting Diode) display panel, or can be an LCD (Liquid Crystal Display) display panel.

In a second aspect, the first direction and the second direction shall not be restricted. The first direction and the second direction can be any arbitrary directions, as long as the first direction and the second direction are substantially perpendicular to each other. In all the embodiments of the present disclosure, for illustration only, the first direction is a horizontal direction, and the second direction is a vertical direction.

In a third aspect, the interval between the first sub-pixels 101 in each row is such that each of the first sub-pixels 101 can be only directed to the left eye through the first light modulating unit 201 and each of the first sub-pixels 101 can be only directed to the right eye through the second light modulating unit 202 thereby avoiding an interference with each other.

As illustrated in FIG. 2A or FIG. 2B, the interval between adjacent first sub-pixels 101 along the first direction can be substantially equal.

Alternatively, as illustrated in FIG. 3A or FIG. 3B, the interval between adjacent first sub-pixels 101 along the first direction may not be exactly equal. In this case, all of the first sub-pixels 101 can be arranged in a manner as illustrated in FIG. 3A or FIG. 3B. Of course, all of the first sub-pixels 101 can be arranged in other manners which are not restricted here, as long as each pixel comprises three first sub-pixels 101 arranged in a triangular pattern.

Further, for the sake of 3D display, it is required that there is no light emitted from the above-described interval located between the first sub-pixels 101 in each row.

In a fourth aspect, the three first sub-pixels 101 in each pixel are used to emit light of three primary colors. For example, as illustrated in FIG. 2 and FIG. 3, the three first sub-pixels emit red (R), green (G) and blue (B) light respectively. But, the embodiments of the present disclosure are not restricted thereto. There can be other three primary colors such as cyan (C), magenta (M) and yellow (Y).

In a fifth aspect, the light modulating component 20 shall not be restricted, as long as the first light modulating unit 201 and the second light modulating unit 202 of the light modulating component 20 can adjust the transmittance of light emitted to the left eye and the transmittance of light emitted to the right eye from each of the first sub-pixels 101 of the display panel 10 respectively.

In the embodiments of the present disclosure, through a configuration in which the three first sub-pixels 101 in each pixel of the display panel 10 are arranged in a triangular pattern and the first sub-pixels 101 are arranged at intervals in the first direction and the second direction and through a configuration in which the light modulating component 20 is disposed on the light-emitting side of the display panel 10, the respective first sub-pixels 101 in the display panel 10 can be directed to the left eye only through the first light modulating unit 201 in the light modulating component 20 and the respective first sub-pixels 101 can be directed to the right eye only through the second light modulating unit 202 in the light modulating component 20. On the basis of the above, by the adjustment of the light transmittances by the light modulating units, gray scales output to the right and left eyes from the respective first sub-pixels 101 are made different from each other, so that the respective first sub-pixels 101 output a left-eye image through the first light modulating unit 201 and a right-eye image through the second light modulating unit 202 which are different from each other. On the basis of this, the left-eye image and the right-eye image are fused by the viewer's brain after a comprehensive analysis, so that the viewer perceives the depth of an object in the screen, thereby producing a three-dimensional effect, i.e. achieving 3D display. When the gray scales output to the right and left eyes from the respective first sub-pixels 101 are made identical, since the respective first sub-pixels 101 output a left-eye image through the first light modulating unit 201 and a right-eye image through the second light modulating unit 202 which are identical, 2D display is achieved. On the basis of this, a switching between 2D display and 3D display can be achieved in a more convenient manner.

In one embodiment of the disclosure, as illustrated in FIG. 2A or FIG. 2B, two of the first sub-pixels 101 in any one of the pixels are arranged in the first direction and the interval between two adjacent first sub-pixels 101 in each row along the first direction is substantially equal.

Here, it would be understood by one of ordinary skills in the art that in order to direct the respective first sub-pixels 101 to the left eye only through the first light modulating unit 201 and direct the respective first sub-pixels 101 to the right eye only through the second light modulating unit 202, so as to prevent an interference therebetween, therefore, an interval between two adjacent first sub-pixels 101 in each row along the first direction cannot be too small.

On the basis of this, in one embodiment of the present disclosure, to ensure a good 3D visual effect, the interval between two adjacent first sub-pixels 101 in each row along the first direction is substantially equal to a length of the first sub-pixel 101 along the first direction. However, in consideration of the manufacture precision in the practical manufacturing process, the interval between two adjacent first sub-pixels 101 in each row along the first direction can be substantially larger than the length of the first sub-pixel 101 along the first direction.

On the basis of this, a width in the second direction at the interval between the first sub-pixels 101 in each row shall be consistent with a width of the first sub-pixel 101 along the second direction, which is required to be configured in accordance with the dimensions of the first light modulating unit 201 and the second light modulating unit 202 and is not restricted here, as long as the respective first sub-pixels 101 is directed to the left eye only through the first light modulating unit 201 and the respective first sub-pixels 101 is directed to the right eye only through the second light modulating unit 202.

According to the embodiments of the present disclosure, by making the interval between two adjacent first sub-pixels 101 in each row substantially equal, not only the display panel 10 can be provided with the first sub-pixels 101 as many as possible, but also the emitting light of the display panel 10 can be made uniform thereby having a better display effect.

Figure 5:
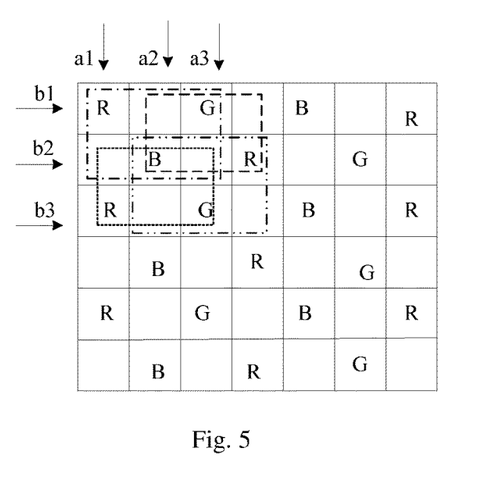
FIG. 5 is an illustrative view of arrangement of a first sub-pixel of a display panel according to an embodiment of the present disclosure.

In one embodiment of the disclosure, as illustrated in FIG. 2A or FIG. 2B and in FIG. 5, along the second direction, the colors of light emitted by the first sub-pixels 101 in each row are the same, and for any three adjacent rows, the colors of light emitted by the first sub-pixels 101 in different rows are different.

An explanation is made by taking FIG. 5 as an example. Along the second direction, any three adjacent rows are a1, a2, a3. The first sub-pixel 101 of Row a1 can emit red (R) light, the first sub-pixel 101 of Row a2 can emit blue (B) light, and the first sub-pixel 101 of Row a3 can emit green (G) light.

On the basis of this, since the first sub-pixels 101 in different rows among any three adjacent rows along the second direction display different colors and the interval between two adjacent first sub-pixels 101 in each row is substantially equal, each of the first sub-pixels 101 can be shared by four pixels. Therefore, each of the first sub-pixels 101 is fully utilized and the pixel rendering effect of the display panel 10 is improved so that the resolution of the display panel 10 is increased.

A plurality of the first sub-pixels 101 defined by the three adjacent rows b1, b2, b3 along the first direction and the three adjacent rows a1, a2, a3 along the second direction are taken as an example. It can be seen that the first sub-pixel 101 (emitting blue light) located at the a2b2 position can be shared by the four pixels defined by the four dashed boxes in FIG. 5.

In one embodiment of the disclosure, the first sub-pixels 101 in each row are separated by black matrixes.

Alternatively, the first sub-pixels 101 in each row are separated by black sub-pixels. The black sub-pixels are nonluminous sub-pixels which display black color.

By providing black matrixes or black sub-pixels at the intervals between the first sub-pixels 101 in each row, the light of the first sub-pixels 101 directed to the left eye through the first light modulating unit 201 can be controlled to be invisible to the right eye and the light of the first sub-pixels 101 directed to the right eye through the second light modulating unit 202 can be controlled to be invisible to the left eye.

Here, when providing black sub-pixels, the black sub-pixels can be formed simultaneously with the first sub-pixels 101. On the basis of this, whether the black matrixes or the black sub-pixels are to be provided, the process is relatively simple.

Figure 6:
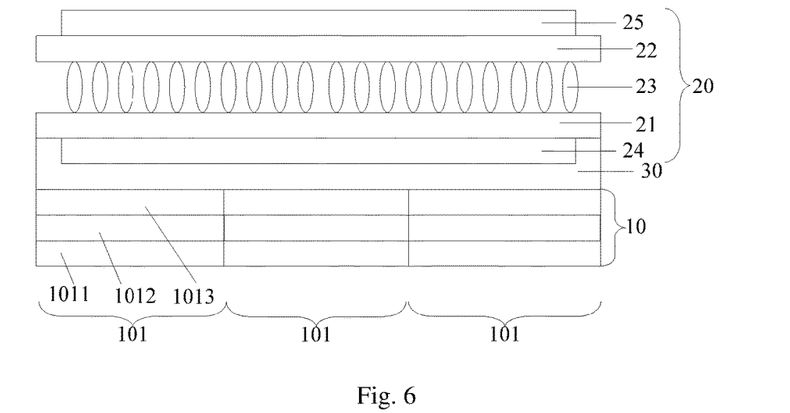
FIG. 6 is an illustrative structural view of a display module consisted by OLED and LCD and according to an embodiment of the present disclosure.

As illustrated in FIG. 6, since the OLED has characters of being thin and light which can reduce the thickness of the entire display module, and the OLED has advantages of high color gamut, high contrast and etc., the display panel 10 is an OLED display panel.

For example, with reference to FIG. 6, each of the first sub-pixels 101 of the OLED display panel can comprise an anode 1011, an organic material functional layer 1012 and a cathode 1013.

The organic material functional layer 1012 at least comprises a light-emitting layer. For different first sub-pixels 101 in one pixel, the light-emitting layers can respectively emit light of different colors, for example, red, green and blue light respectively.

On the basis of this, each of the first sub-pixels 101 can further comprise a thin film transistor, a drain electrode of which is electrically connected with the anode 1011.

Figure 7:
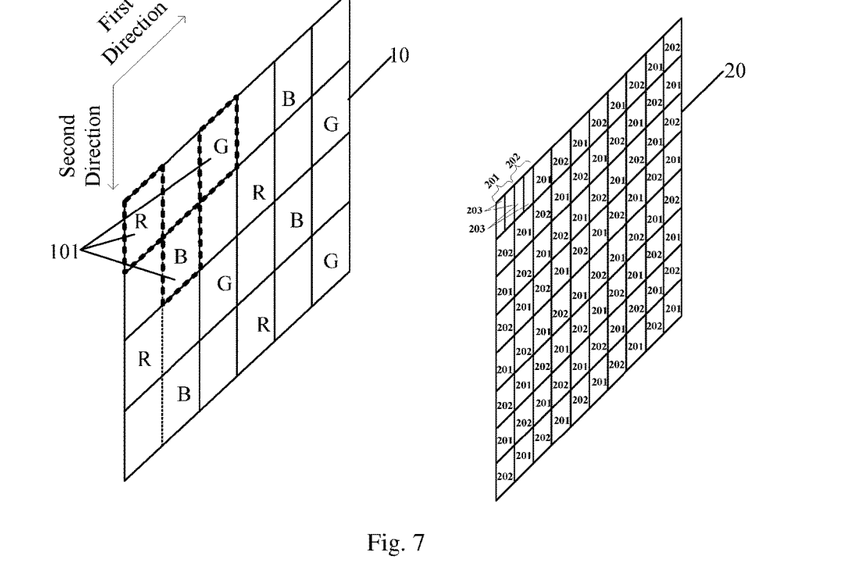
FIG. 7 is a third illustrative view of a display module according to an embodiment of the present disclosure.

In one embodiment of the disclosure, as illustrated in FIG. 7, the light modulating component 20 is a liquid crystal display panel which comprises a plurality of second sub-pixels 203. The first light modulating unit 201 and the second light modulating unit 202 each comprise at least one of the second sub-pixels 203. The liquid crystal display panel does not comprise a color film.

For example, as illustrated in FIG. 6, the liquid crystal display panel comprises an array substrate 21 and a counter substrate 22, as well as a liquid crystal layer 23 interposed therebetween. Further, the liquid crystal display panel can further comprise a lower polarizer 24 positioned at a side of the array substrate 21 away from the liquid crystal layer 23 and an upper polarizer 25 positioned at a side of the counter substrate away from the liquid crystal layer 23.

Each of the sub-pixels in the array substrate 21 can comprises a thin film transistor and a pixel electrode which is electrically connected with the drain electrode of the thin film transistor. The common electrode can be positioned on the array substrate 21 or the counter substrate 22. The counter substrate 22 does not comprise a color film.

Furthermore, the OLED display panel and the liquid crystal display panel can be connected by the sealant 30.

It is to be noted that due to process reasons, the sub-pixels in the liquid crystal display panel can be made smaller than the sub-pixels in the OLED display panel. On the basis of this, the first light modulating unit 201 and the second light modulating unit 202 can each comprise at least one second sub-pixels 203, which can be appropriately set as required.

In the embodiments of the present disclosure, since the first light modulating unit 201 and the second light modulating unit 202 each comprise at least one second sub-pixels 203, by controlling the deflection angle of the liquid crystals in the second sub-pixels 203, the transmittance of light emitted to the left eye and the transmittance of light emitted to the right eye from the first sub-pixels 101 are controlled, thereby achieving 2D or 3D display.

Further, when the first light modulating unit 201 and the second light modulating unit 202 each comprise two or more second sub-pixels 203, the second sub-pixels 203 can control the deflection angle of the liquid crystals independently and thus control the light transmittance. Therefore, compared with the first light modulating unit 201 and the second light modulating unit 202 comprising only one second sub-pixels 203, the screen resolution can be improved.

Figure 8:
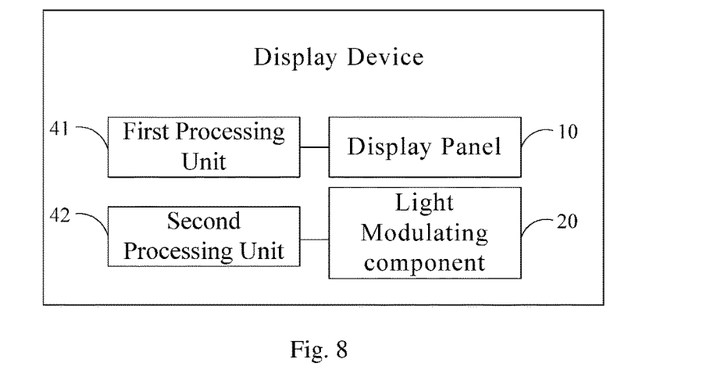
FIG. 8 is a first illustrative view of a display device according to an embodiment of the present disclosure.

The embodiments of the present disclosure further provide a display device, as illustrated in FIG. 8, comprising the above-described display module, a first processing unit 41 connected with the display panel 10 in the display module, and a second processing unit 42 connected with the light modulating component 20.

The first processing unit 41 is configured to control the first sub-pixels 101 in each pixel of the display panel 10 to emit light of three primary colors. The second processing unit 42 is configured to control the light transmittances of the first light modulating unit 201 and the second light modulating unit 202 in the light modulating component 20, so that the respective first sub-pixels output the left-eye image through the first light modulating unit 201 and the respective first sub-pixels output the right-eye image through the second light modulating unit 202.

Through controlling the light transmittances of the first light modulating unit 201 and the second light modulating unit 202 by the second processing unit 42, gray scales output to the right and left eyes from the respective first sub-pixels 101 in the display panel 10 are made different from each other, so that the left-eye image output by the respective first sub-pixels 101 through the first light modulating unit 201 and the right-eye image output by the respective first sub-pixels 101 through the second light modulating unit 202 are different from each other. On the basis of this, the left-eye image and the right-eye image are fused by the viewer's brain after a comprehensive analysis, so that the viewer perceives the depth of an object in the screen, thereby producing a three-dimensional effect, i.e. achieving 3D display. When the gray scales output to the right and left eyes from the respective first sub-pixels 101 are made identical with each other, since the left-eye image output by the respective first sub-pixels 101 through the first light modulating unit 201 and the right-eye image output by the first respective sub-pixels 101 through the second light modulating unit 202 are identical, 2D display is achieved.

Figure 9:
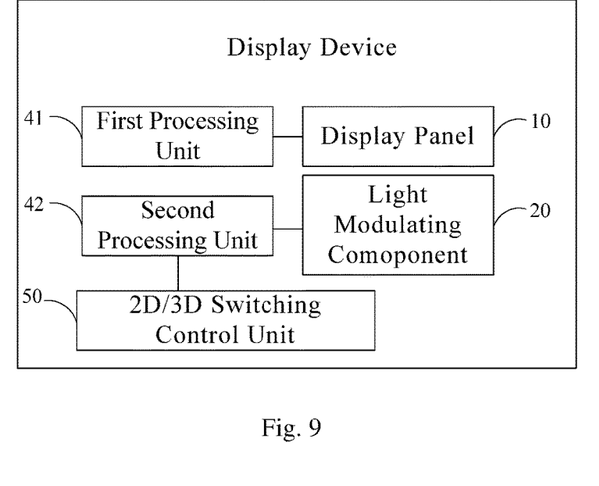
FIG. 9 is a second illustrative view of a display device according to an embodiment of the present disclosure.

In one embodiment of the disclosure, as illustrated in FIG. 9, the display device further comprises a 2D/3D switching control unit 50 connected with the second processing unit 42.

In 2D display, the 2D/3D switching control unit 50 is configured to control the light transmittances of the first light modulating unit 201 and the second light modulating unit 202 by the second processing unit 42, so that the left-eye image output by the respective first sub-pixels 101 through the first light modulating unit 201 and the right-eye image output by the respective first sub-pixels 101 through the second light modulating unit 202 are identical.

In 3D display, the light transmittances of the first light modulating unit 201 and the second light modulating unit 202 are controlled by the second processing unit 42, so that the left-eye image output by the respective first sub-pixels 101 through the first light modulating unit 201 and the right-eye image output by the first respective sub-pixels 101 through the second light modulating unit 202 are different.

Here, the 2D/3D switching control unit 50 can perform a switching between 2D and 3D upon a switching request received from the user.

By providing the 2D/3D switching control unit 50 connected with the second processing unit 42, the embodiments of the present disclosure can achieve a switching between 2D and 3D more conveniently so that an appropriate display mode can be selected as required.

Figure 10:
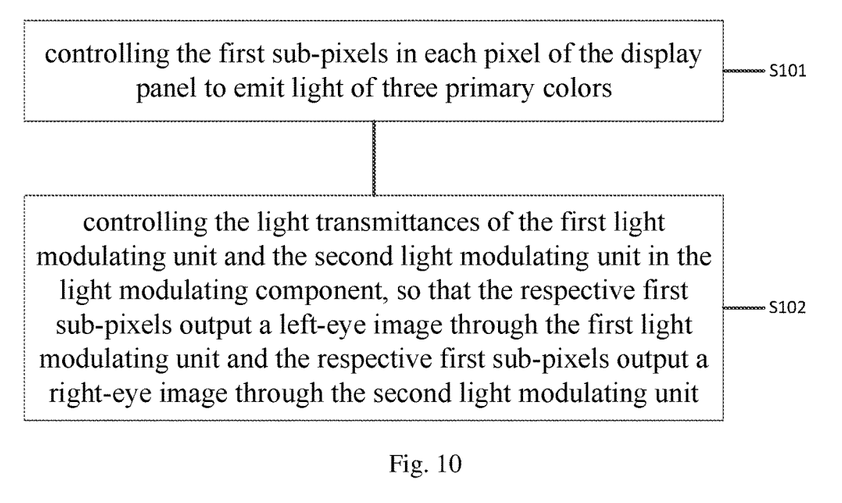
FIG. 10 is an illustrative flow chart of a driving method for a display device according to an embodiment of the present disclosure.

Embodiments of the present disclosure further provide a driving method for the above-described display device, comprising a step S101 and a step S102, as illustrated in FIG. 10.

In the step S101, controlling the first sub-pixels 101 in each pixel of the display panel 10 to emit light of three primary colors.

For example, the first sub-pixels 101 in each pixel of the display panel 10 are controlled to emit light of three primary colors by the first processing unit 41.

In the step S102, controlling the light transmittances of the first light modulating unit 201 and the second light modulating unit 202 in the light modulating component 20, so that the respective first sub-pixels 101 output a left-eye image through the first light modulating unit 201 and the respective first sub-pixels 101 output a right-eye image through the second light modulating unit 202.

For example, the step S102 is as follows. In 2D, the second processing unit 42 controls the light transmittances of the first light modulating unit 201 and the second light modulating unit 202, so that the left-eye image output by the respective first sub-pixels 101 through the first light modulating unit 201 and the right-eye image output by the respective first sub-pixels 101 through the second light modulating unit 202 are identical with each other.

In 3D, the second processing unit 42 controls the light transmittances of the first light modulating unit 201 and the second light modulating unit 202, so that the left-eye image output by the respective first sub-pixels 101 through the first light modulating unit 201 and the right-eye image output by the first respective sub-pixels 101 through the second light modulating unit 202 are different from each other.

On the basis of this, the 2D/3D switching control unit 50 can be controlled more conveniently to perform the above-described conversion between 2D and 3D based on a switching request by the user.

It will be appreciated by one of ordinary skills in the art that all or part of the steps of implementing the method embodiments described above can be accomplished by program-related hardware. The program may be stored in a computer readable storage medium. When the program is executed, the steps of the method embodiments are implemented. The above-described storage medium includes various kinds of media such as a ROM, a RAM, a magnetic disk, an optical disk, and the like, which can store program codes.

The foregoing are merely exemplary embodiments of the disclosure. The protection scope of the disclosure shall not be limited thereto. Variations and modifications which are easily conceivable to one of ordinary skills in the art within the technical scope of this disclosure fall within the protection scope of the present disclosure. Accordingly, the protection scope of the present disclosure is defined by the protection scope of the claims.

The invention claimed is:

1. A display module, comprising a display panel and a light modulating component,
   wherein the display panel comprises a plurality of pixels, each of which comprises three first sub-pixels arranged in a triangular pattern, wherein all of the first sub-pixels are arranged in a plurality of rows in a first direction and in a plurality of rows in a second direction, and the first sub-pixels in each row are arranged at intervals, the first direction being substantially perpendicular to the second direction; and
   the light modulating component comprises a first light modulating unit configured to adjust transmittance of light emitted to the left eye by the respective first sub-pixels of the display panel and a second light modulating unit configured to adjust transmittance of light emitted to the right eye by the respective first sub-pixels of the display panel.

2. The display module according to claim 1, wherein two of the first sub-pixels in any one of the pixels are arranged in the first direction and the interval between two adjacent first sub-pixels in each row along the first direction is substantially equal.

3. The display module according to claim 1, wherein along the second direction, the colors of light emitted by the first sub-pixels in each row are the same, and for any three adjacent rows, the colors of light emitted by the first sub-pixels in different rows are different.

4. The display module according to claim 1, wherein the first sub-pixels in each row are separated by black matrixes.

5. The display module according to claim 1, wherein the first sub-pixels in each row are separated by black sub-pixels.

6. The display module according to claim 1, wherein the display panel is an OLED display panel.

7. The display module according to claim 1, wherein the light modulating component is a liquid crystal display panel which comprises a plurality of second sub-pixels; and
   the first light modulating unit and the second light modulating unit each comprise at least one of the second sub-pixels.

8. The display module according to claim 7, wherein the liquid crystal display panel does not comprise a color film.

9. The display module according to claim 2, wherein two of the first sub-pixels in any one of the pixels are arranged in the first direction and the interval between two adjacent first sub-pixels in each row along the first direction is substantially larger than a length of the first sub-pixel along the first direction.

10. The display module according to claim 2, wherein two of the first sub-pixels in any one of the pixels are arranged in the first direction and the interval between two adjacent first sub-pixels in each row along the first direction is substantially equal to a length of the first sub-pixel along the first direction.

11. The display module according to claim 7, wherein each of the second sub-pixels in the light modulating component has a size smaller than that of each of the first sub-pixels in the display panel.

12. A display device, comprising:
   the display module according to claim 1;
   a first processing unit connected with the display panel in the display module; and
   a second processing unit connected with the light modulating component in the display module,
   wherein the first processing unit is configured to control the first sub-pixels in each pixel of the display panel to emit light of three primary colors; and
   the second processing unit is configured to control the light transmittances of the first light modulating unit and the second light modulating unit in the light modulating component, so that the respective first sub-pixels in the display module output the left-eye image through the first light modulating unit and output the right-eye image through the second light modulating unit.

13. The display device according to claim 12, further comprising:
   a 2D/3D switching control unit connected with the second processing unit,
   wherein the 2D/3D switching control unit is configured to control the light transmittances of the first light modulating unit and the second light modulating unit through the second processing unit in 2D display, so that the left-eye image output by the respective first sub-pixels through the first light modulating unit and the right-eye image output by the respective first sub-pixels through the second light modulating unit are identical; and
   the 2D/3D switching control unit is configured to control the light transmittances of the first light modulating unit and the second light modulating unit through the second processing unit in 3D display, so that the left-eye image output by the respective first sub-pixels through the first light modulating unit and the right-eye image output by the respective first sub-pixels through the second light modulating unit are different.

14. A driving method of the display device according to claim 12, comprising:
   controlling the first sub-pixels within each pixel in the display panel to emit light of three primary colors; and
   controlling the light transmittances of the first light modulating unit and the second light modulating unit in the light modulating component, so that the respective first sub-pixels output a left-eye image through the first light modulating unit and output a right-eye image through the second light modulating unit.

15. The driving method according to claim 14, wherein, in 2D display, controlling the light transmittances of the first light modulating unit and the second light modulating unit, so that the left-eye image output by the respective first sub-pixels through the first light modulating unit and the right-eye image output by the respective first sub-pixels through the second light modulating unit are identical, and
   in 3D display, controlling the light transmittances of the first light modulating unit and the second light modulating unit, so that the left-eye image output by the respective first sub-pixels through the first light modulating unit and the right-eye image output by the respective first sub-pixels through the second light modulating unit are different.

16. The display module according to claim 2, wherein along the second direction, the colors of light emitted by the first sub-pixels in each row are the same, and for any three adjacent rows, the colors of light emitted by the first sub-pixels in different rows are different.

17. The display module according to claim 2, wherein the first sub-pixels in each row are separated by black matrixes.

18. The display module according to claim 2, wherein the first sub-pixels in each row are separated by black sub-pixels.

19. The display module according to claim 2, wherein the display panel is an OLED display panel.

20. The display module according to claim 2, wherein the light modulating component is a liquid crystal display panel which comprises a plurality of second sub-pixels; and the first light modulating unit and the second light modulating unit each comprise at least one of the second sub-pixels.

* * * * *